(12) United States Patent
Chen et al.

(10) Patent No.: US 7,916,523 B2
(45) Date of Patent: Mar. 29, 2011

(54) METHOD OF ERASING A RESISTIVE MEMORY DEVICE

(75) Inventors: An Chen, Sunnyvale, CA (US); Sameer Haddad, San Jose, CA (US); Yi-Ching Jean Wu, Sunnyvale, CA (US); Swaroop Kaza, Sunnyvale, CA (US)

(73) Assignee: Spansion LLC, Sunnyvale, CA (US)

( * ) Notice: Subject to any disclaimer, the term of this patent is extended or adjusted under 35 U.S.C. 154(b) by 398 days.

(21) Appl. No.: 11/633,941

(22) Filed: Dec. 5, 2006

(65) Prior Publication Data
US 2008/0130392 A1 Jun. 5, 2008

(51) Int. Cl.
*G11C 11/00* (2006.01)
(52) U.S. Cl. ............... 365/163; 365/185.19; 365/185.29
(58) Field of Classification Search .................. 365/163, 365/185.19, 185.29
See application file for complete search history.

(56) References Cited

U.S. PATENT DOCUMENTS

| | | | | |
|---|---|---|---|---|
| 7,145,791 B2 * | 12/2006 | Tsushima et al. | ............. | 365/148 |
| 7,167,390 B2 * | 1/2007 | Ishida et al. | ............. | 365/163 |
| 7,289,351 B1 * | 10/2007 | Chen et al. | ............. | 365/148 |
| 7,400,528 B2 * | 7/2008 | Happ et al. | ............. | 365/185.03 |
| 2006/0104111 A1 * | 5/2006 | Tripsas et al. | ............. | 365/175 |

OTHER PUBLICATIONS

Reproducibleswitching effect in thin oxide films for memory applications, Beck et al., Applied Physics Letters, vol. 77, No. 1, Jul. 3, 2000, pp. 139-141.
Current-driven insulator-conductortransition and nonvolatile memory in chromium-dopedSrTiO3 single crystals, Watanabe et al., Applied Physics Letters, vol. 78, No. 123 Jun. 4, 2001, pp. 3738-3740.
Hysteretic current-voltagecharncteristics and resistance switching at an epitaxial oxide Schottky junction SrRuO3/SrTi0.99Nb0.01O3,Fuji et al., Applied Physics Letters 86, 012107 (2005), pp. 1-3.
The role of space-charge-limited-currentconduction in evaluation of the electrical properties of thin Cu2O film, Rakhshani, Journal of Applied Physics 69, Feb. 14, 1991, pp. 2365-2369.

* cited by examiner

*Primary Examiner* — Son Dinh

(57) ABSTRACT

In a first method of erasing a resistive memory device, an electrical potential is applied to the gate of a transistor in series with the resistive memory device, and successive increasing currents are provided through the resistive memory device by means of providing successive increasing electrical potentials across the resistive memory device. In a second method of erasing a resistive memory device, an electrical potential is applied across the resistive memory device, and successive increasing currents are provided through the resistive memory device by means of providing successive increasing electrical potentials to the gate of a transistor in series with the resistive memory device.

23 Claims, 13 Drawing Sheets

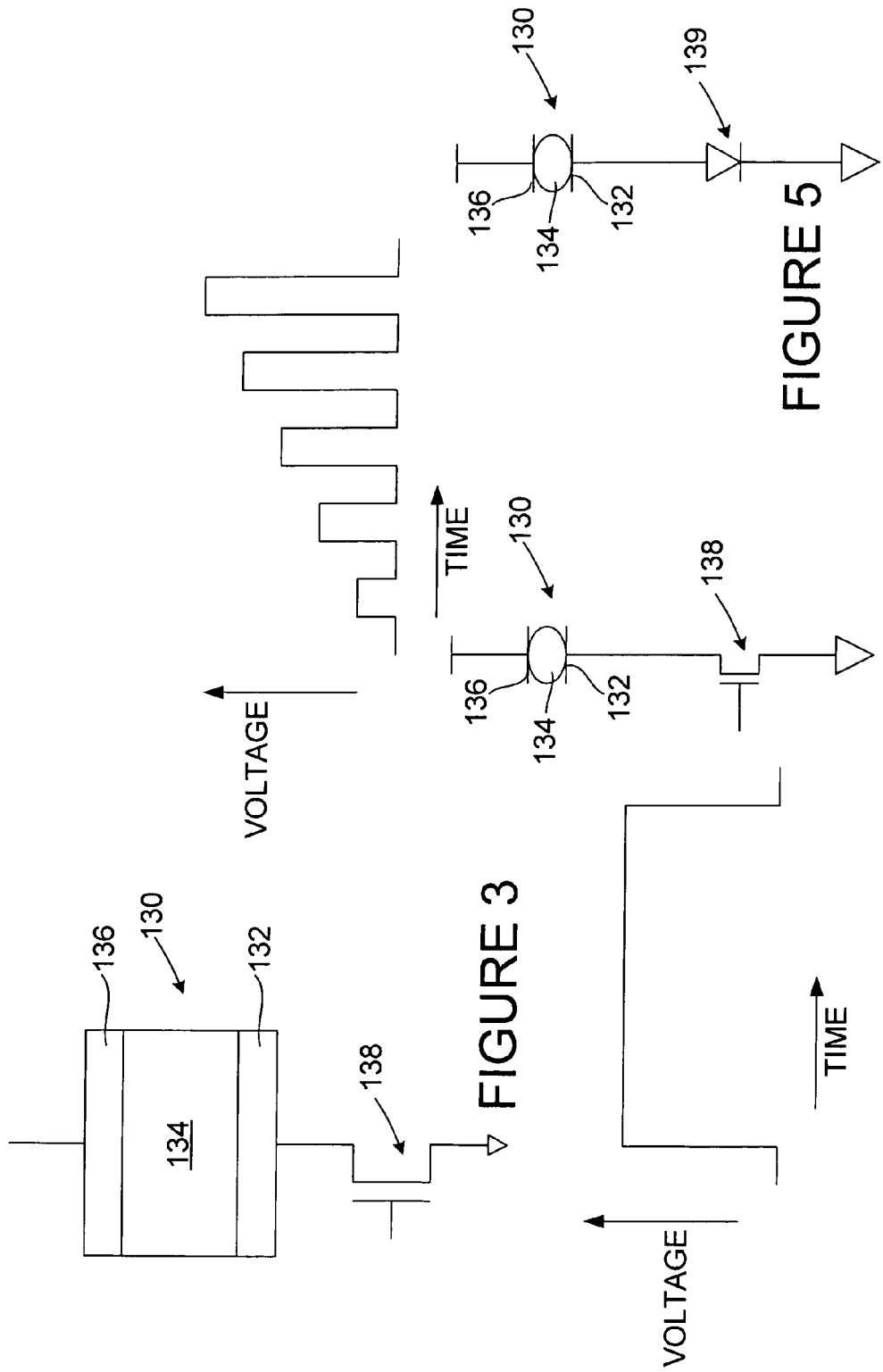

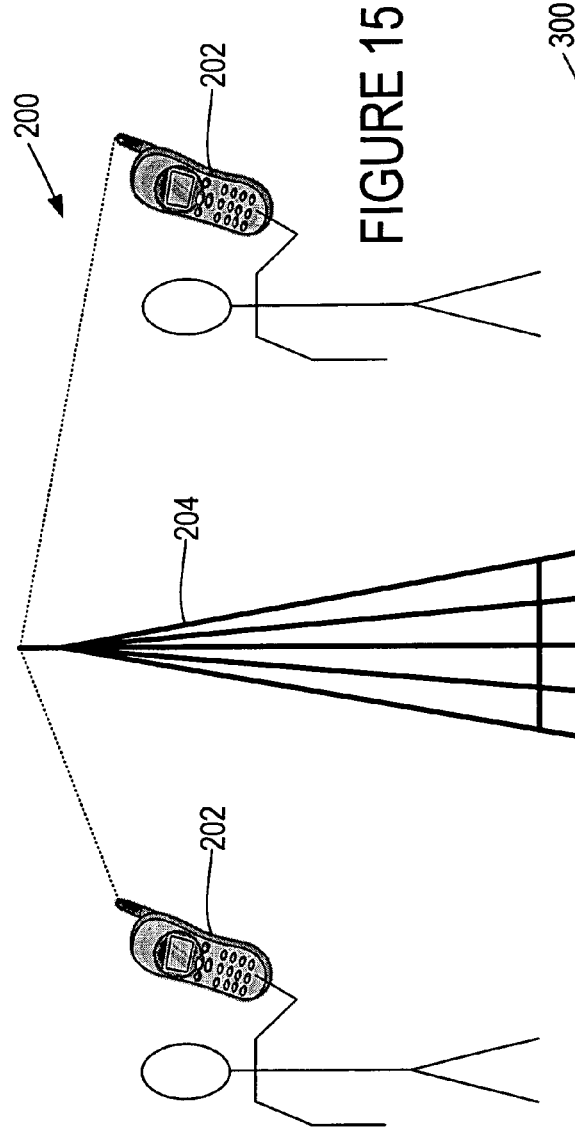
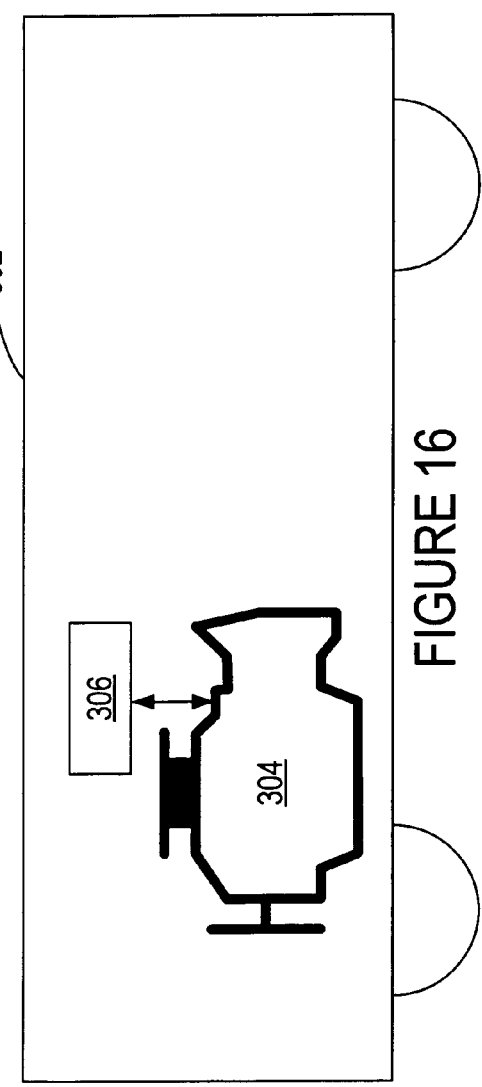

METHOD OF ERASING A RESISTIVE MEMORY DEVICE

BACKGROUND OF THE INVENTION

1. Technical Field

This invention relates generally to memory devices, and more particularly, to resistive memory device operation.

2. Background Art

FIG. 1 illustrates a memory device 30 known as a metal-insulator-metal (MIM) device which includes an electrode 32, an insulating layer 34 (also known as a switching layer) on and in contact with the electrode 32, and an electrode 36 on and in contact with the insulating layer 32, so the insulating layer 34 is between the electrodes 32, 36. The electrode 32 is connected to the drain of an MOS transistor 38, while the source of the transistor 38 is connected to ground, so that the memory device 30 and transistor 38 are in series.

Initially, assuming that the memory device 30 is unprogrammed, high-resistance state, in order to program the memory device 30, a programming voltage $V_{pg}$ is applied to the electrode 36, so that an electrical potential is applied across the memory device 30 from a higher to a lower potential in the direction from electrode 36 to electrode 32, (see FIG. 2, a plot of memory device current vs. voltage applied to the electrode 36 of the memory device 30). This voltage $V_{pg}$ is sufficient to cause charge carriers to be moved into the insulating layer 34, causing the insulating layer 34 (and the overall memory device 30) to rapidly switch to a low-resistance or conductive state (A). Upon removal of such potential, the charge carriers moved into the insulating layer 34 during the programming step remain therein, so that the insulating layer 34 (and memory device 30) remain in a conductive or low-resistance state, as indicated by the on-state resistance characteristic (B). The voltage $V_{ga}$ applied to the gate of the transistor 38 determines the magnitude of current through the memory device 30 during the programming step.

In order to erase the memory device 30, a positive voltage $V_{er}$ is applied to the electrode 36, so that an electrical potential is applied across the memory device 30 from a higher to a lower electrical potential in the same direction as in programming the device 30. This potential $V_{er}$ is sufficient to cause charge carriers to move from the insulating layer 34, in turn causing the insulating layer 34 (and the overall memory device 30) to be in a high-resistance or substantially non-conductive state. This state remains upon removal of such potential from the memory device 30. The gate voltage $V_{gb}$ again determines the magnitude of current through the memory device 30. As illustrated, the erase voltage $V_{er}$ is lower than the programming voltage $V_{pg}$, and the current provided through the memory device 30 during the erase step (C) is higher than the current through the device 30 during the programming step (based on a higher gate voltage during the erase step than during the programming step). Higher gate voltage is usually needed for erase to provide higher current through the device 30 during the erase step.

FIG. 2 also illustrates the read step of the memory device 30 in its programmed (conductive) state and in its erased (nonconductive) state. A voltage $V_r$ is applied to the electrode 36 so that an electrical potential is applied across the memory device 30 from a higher to a lower electrical potential in the same direction as in the programming and erase steps. This voltage $V_r$ is lower than the voltage $V_{pg}$ applied for programming and is lower than the voltage $V_{er}$ applied for erasing (see above). In this situation, if the memory device 30 is programmed, the memory device 30 will readily conduct current, indicating that the memory device 30 is in its programmed state. If the memory device 30 is erased, the memory device 30 will not conduct current, indicating that the memory device 30 is in its erased state.

Typically, erasing of a memory device is achieved by applying a fixed number of voltage pulses at constant height across the device 30. Because of physical differences between memory devices in a memory device array, the electrical potential required to achieve erasing can vary between memory devices. Applying a constant erasing electrical potential to a memory device which is substantially greater than that required for erasing can result in overstress of the device. Therefore, what is needed is an approach wherein, while proper erasing of the memory device is achieved, application of excessive unneeded electrical erasing potential is avoided. In addition, the memory device should be structured to promote efficient switching operation thereof.

DISCLOSURE OF THE INVENTION

The present method of erasing a resistive memory device comprises applying successive increasing voltages across or current limits through the resistive memory device.

The present invention is better understood upon consideration of the detailed description below, in conjunction with the accompanying drawings. As will become readily apparent to those skilled in the art from the following description, there are shown and described embodiments of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of illustrative embodiments when read in conjunction with the accompanying drawings, wherein:

FIG. 3 is a cross-sectional view of an embodiment of the present memory device;

FIG. 4 is a schematic view illustrating erasing of the device of FIG. 3 in accordance with a first embodiment of the invention;

FIG. 5 is a schematic view of an alternative device for practicing the process of FIG. 4;

FIGS. 15-17 are systems incorporating memory devices of the present type.

BEST MODE(S) FOR CARRYING OUT THE INVENTION

Figure 1:
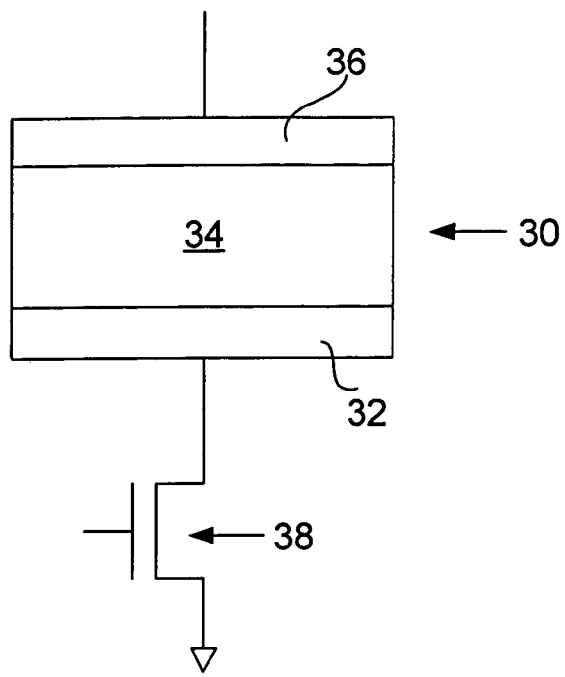
FIG. 1 is a cross-sectional view of the memory device as described above.
Figure 2:
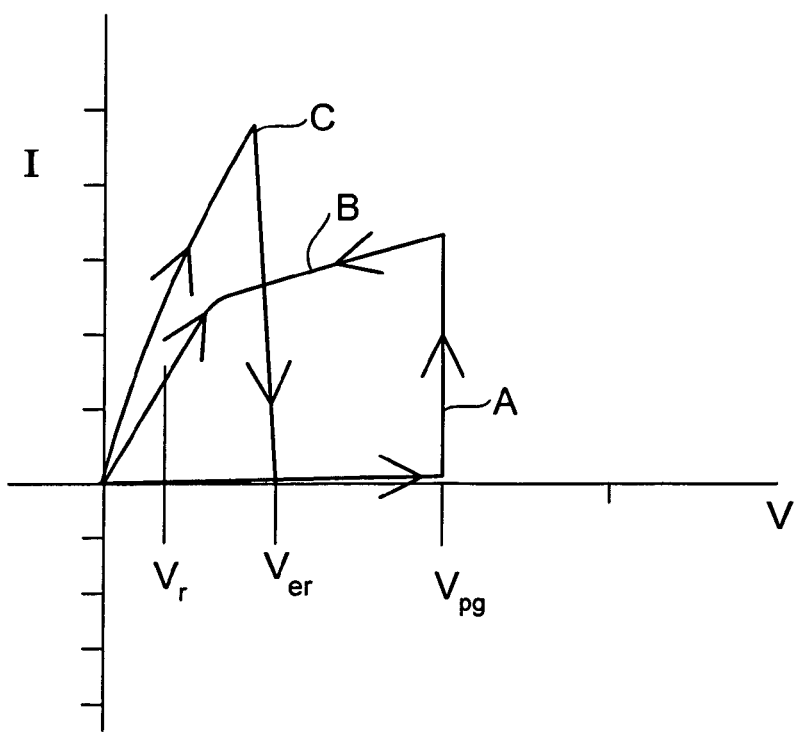
FIG. 2 is a plot of current vs. voltage in the programming, reading and erasing of the memory device of FIG. 1.

Reference is now made in detail to specific embodiments of the present invention which illustrate the best mode presently contemplated by the inventors for practicing the invention.

FIG. 3 illustrates the present resistive memory device 130. Similar to the previously shown and described device 30, the resistive memory device 130 includes an electrically conductive electrode 132 (for example copper, Cu), an insulating (switching) layer 134, for example a copper oxide layer, $CuO_x$ on and in contact with the electrode 132, and an electrically conductive electrode 136 (for example nickel, Ni) on and in contact with the insulating layer 134, so that the insulating layer 134 is between the electrodes 132, 136. The electrode 132 is connected to the drain of an access MOS transistor 138, which has its source connected to ground. The transistor 138 is thus connected in series with the device 130. This circuitry is shown in schematic form in FIG. 4.

As an alternative (FIG. 5), a diode 139 may replace the transistor 138, the diode 139 having one terminal connected to the electrode 132 and the other terminal connected to ground, and being forward biased in the direction from memory device 130 to ground. The diode 139 is thus connected in series with the device 130.

The switching mechanism is explained based on the Space-Charge-Limited-Conduction model. In a solid material with unfilled deep traps, SCLC current is significantly lowered from the trap-free case by a ratio θ, determined by the trap depth ($\Delta E_t$) and density ($N_t$) as $\theta \propto exp(\Delta E_t/kT)/N_t$. A dramatic resistance reduction occurs when the deep traps are filled at the traps-filled-limit voltage ($V_{TFL}$) that is determined by the unfilled deep trap density. After that the material is switched from a high-resistance state ("OFF") into a low-resistance state ("ON"). The ON state retention is determined by the "thermal release time" (de-trapping through thermal processes) that is exponentially proportional to $\Delta E_t$.

Figure 6:
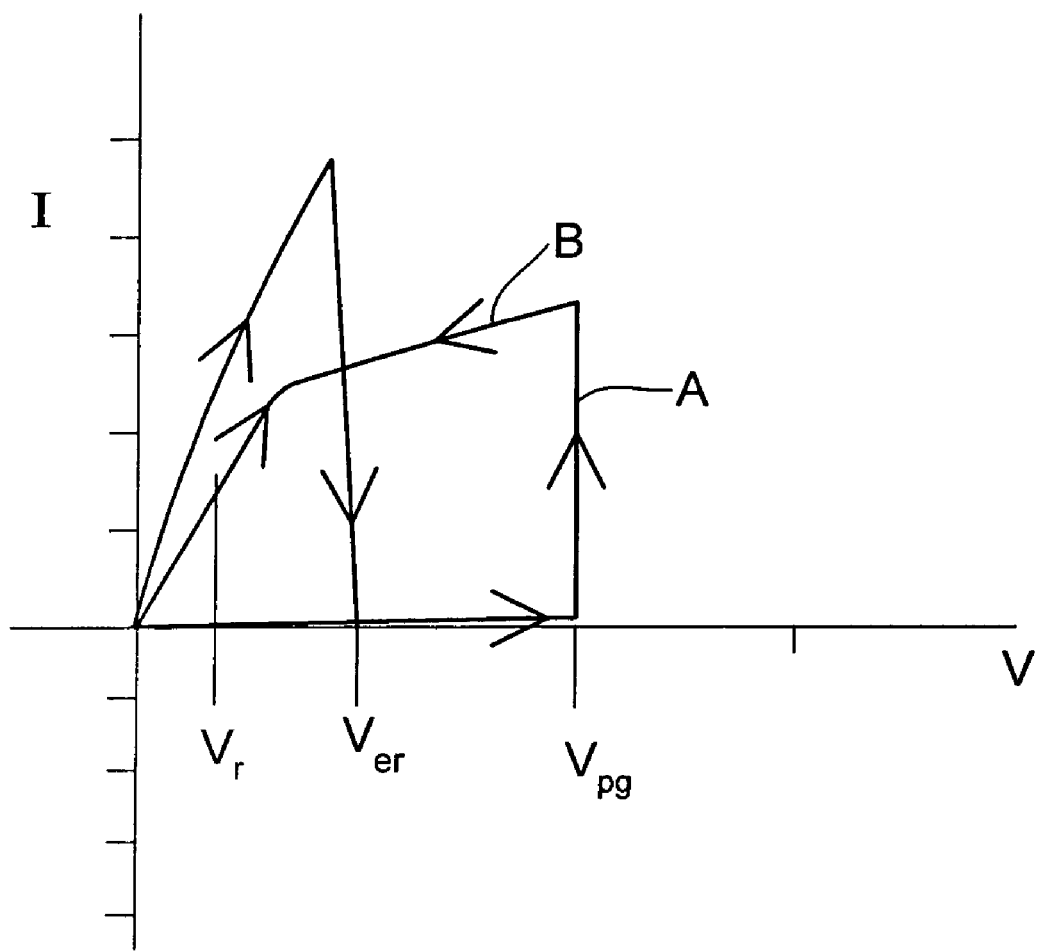
FIG. 6 is a plot of current vs. voltage in the programming, reading and erasing of the memory device of FIG. 3.

FIG. 6 is a plot of memory device current vs. electrical potential applied across the memory device 130. In order to program the memory device 130, an electrical potential $V_{pg}$ (the "program" electrical potential) is applied across the memory device 130 from a higher to a lower electrical potential in the direction of from electrode 136 to electrode 132. This causes electronic charge carriers in the form of electrons and/or holes to enter the insulating layer 134 and fill the traps in layer 134, to provide that the overall memory device 130 is in a conductive, low-resistance (programmed) state (A). Upon removal of such potential the memory device 130 remains in a conductive or low-resistance state having an on-state resistance indicated at (B), due to the long retention associated with deep trap levels.

In order to erase the memory device 130, an electrical potential $V_{er}$ (the "erase" electrical potential) is applied across the memory device 130 from a higher to a lower electrical potential in the direction of from electrode 136 to electrode 132. Application of this electrical potential causes electronic charge carriers to leave the traps in the insulating layer 134, so that the overall memory device 130 is in a high-resistance (erased) state.

In this disclosure, two erasing methods are provided which are applicable to this type of resistive memory device based on SCLC model.

Figure 7:
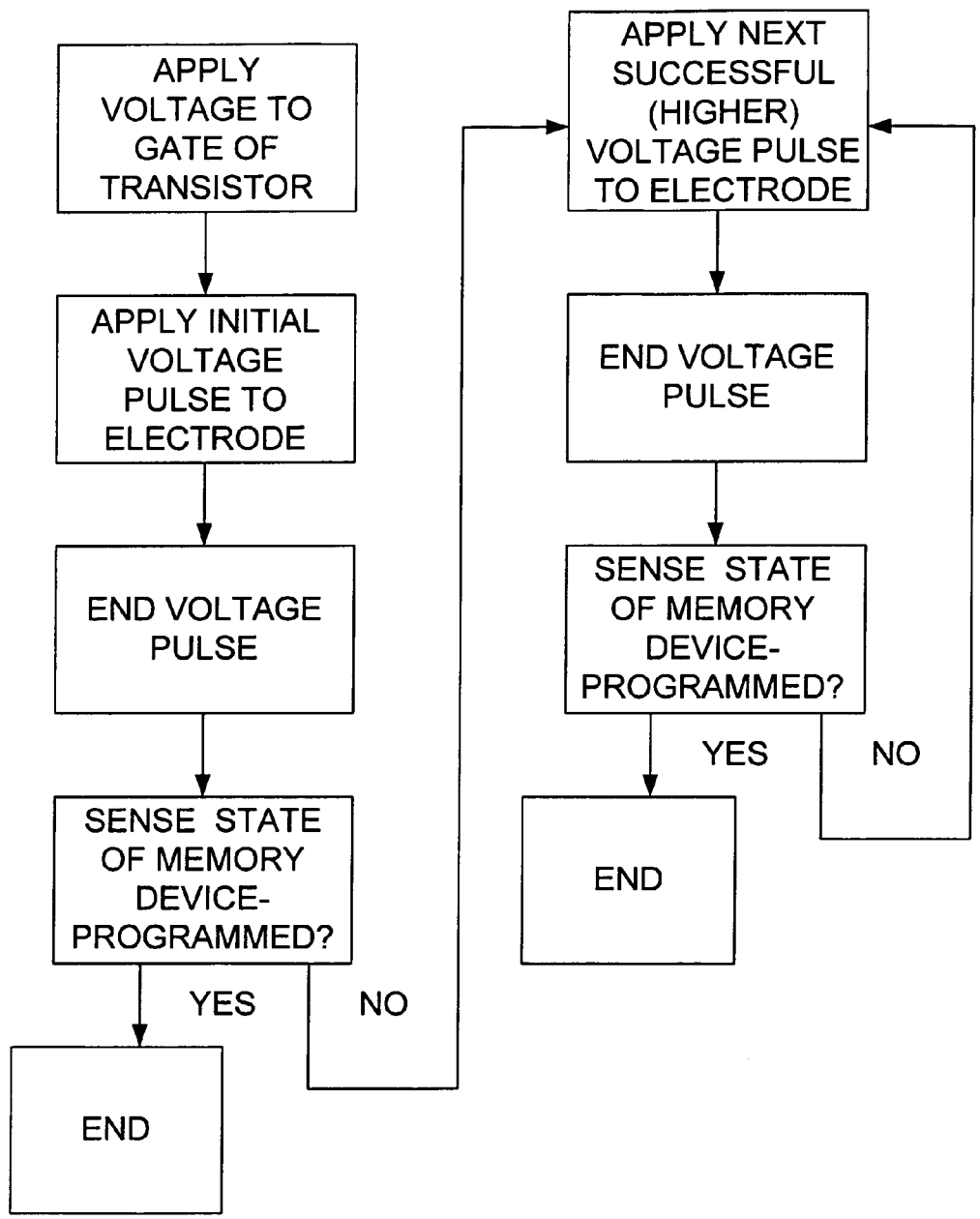
FIG. 7 is a flow chart illustrating steps in the method of FIG. 4.

With reference to FIGS. 3-7, a first method of erasing the programmed memory device 130 is provided. Initially, a constant voltage is applied to the gate of the transistor 138. This voltage is maintained while individual, successive, increasing electrical potentials in the form of voltage pulses are applied to the electrode 136 of the device 130, causing successive increasing electrical potential to be applied across the device 130 from higher to lower potential in the direction from the electrode 136 to the electrode 132. The successive voltage pulses, which may be as short as 10 ns, provide successively increasing levels of voltage across the memory device 130. As explained above, application of an erasing electrical potential which is substantially greater than that required for erasing can result in overstress of the device. In order to avoid this problem, the voltage across the device 130 is ramped from low to high with the state of the device 130 being checked after each pulse and the erase pulsing is stopped as soon as the targeted erased state is achieved. With reference to FIG. 7, after the voltage is applied to the gate as described above, the initial voltage pulse is applied to the electrode 136, providing a first level of potential across the device 130. After the first voltage pulse is ended, and before the beginning of the second, greater voltage pulse, the state of the memory device 130 is sensed by providing a read potential thereacross to determine if erasing has been achieved, i.e., the device 130 has been properly erased. If so, application of voltage to the electrode 136 is ended, and the device 130 can be considered erased. On the other hand, if erasing has not been achieved, the next successive (second) voltage pulse, greater in magnitude than the initial voltage pulse, is applied to the electrode 136. After this second voltage pulse is ended, and before the beginning of the third, greater voltage pulse, the state of the memory device 130 is sensed by providing a read potential thereacross to determine if erasing has been achieved, i.e., the device 130 has been properly erased. Again, if the device 130 has been so erased, application of voltage to the electrode 136 is ended, and the device 130 can be considered erased. If such erase has not been achieved, the process is continued as illustrated in FIG. 6 until proper erasing is achieved.

It will be noted that only the minimum number of successive, increasing voltage pulses on electrode 136 (and resulting successive, increasing pulsed currents through the memory device 130) are needed and used to erase the device 130. This approach allows for efficient erasing of the device 130. That is, as the level of voltage on the electrode 136 is ramped up through application of the successive voltage pulses, the erase process ends as soon as the level of voltage applied to the electrode 136 is sufficient to provide the chosen erase current limit for erasing through the device 130.

Figure 8:
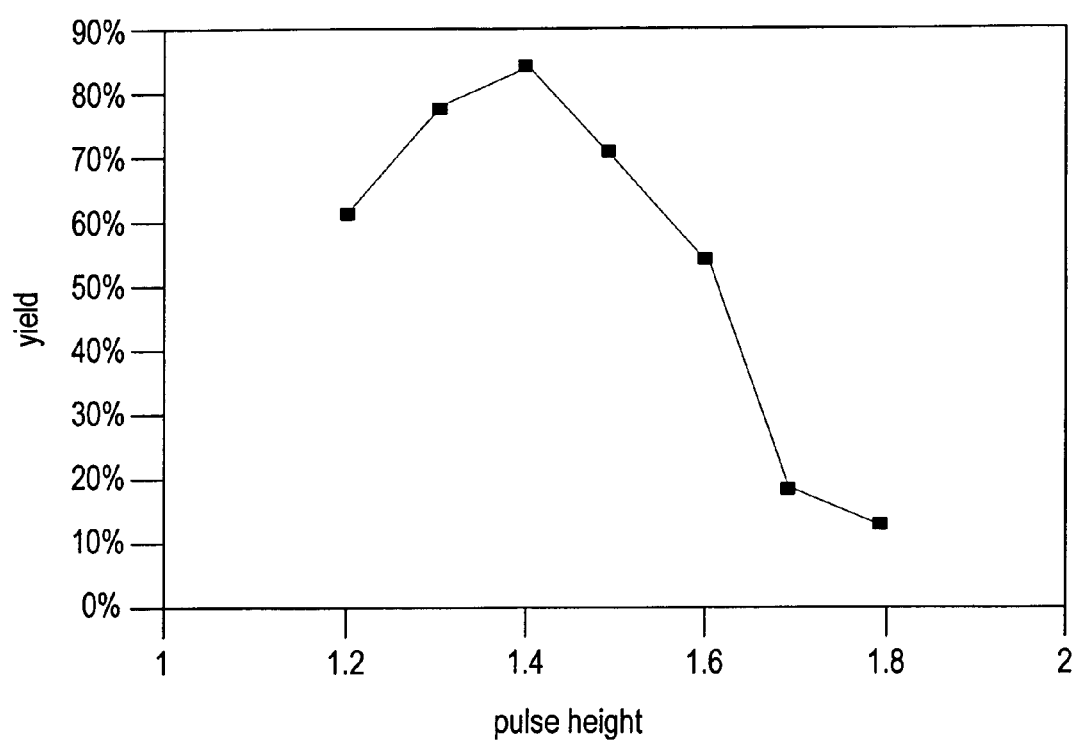
FIG. 8 is a graph illustrating effectiveness of erasing dependent on pulse height in accordance with the method of FIGS. 4 and 7.

As shown in FIG. 8, peak erase yield is achieved when an appropriate voltage is applied across the device. Too high a voltage across the device will reduce the erase yield and also waste energy and operation time. This problem is overcome through the above described approach.

Figure 9:
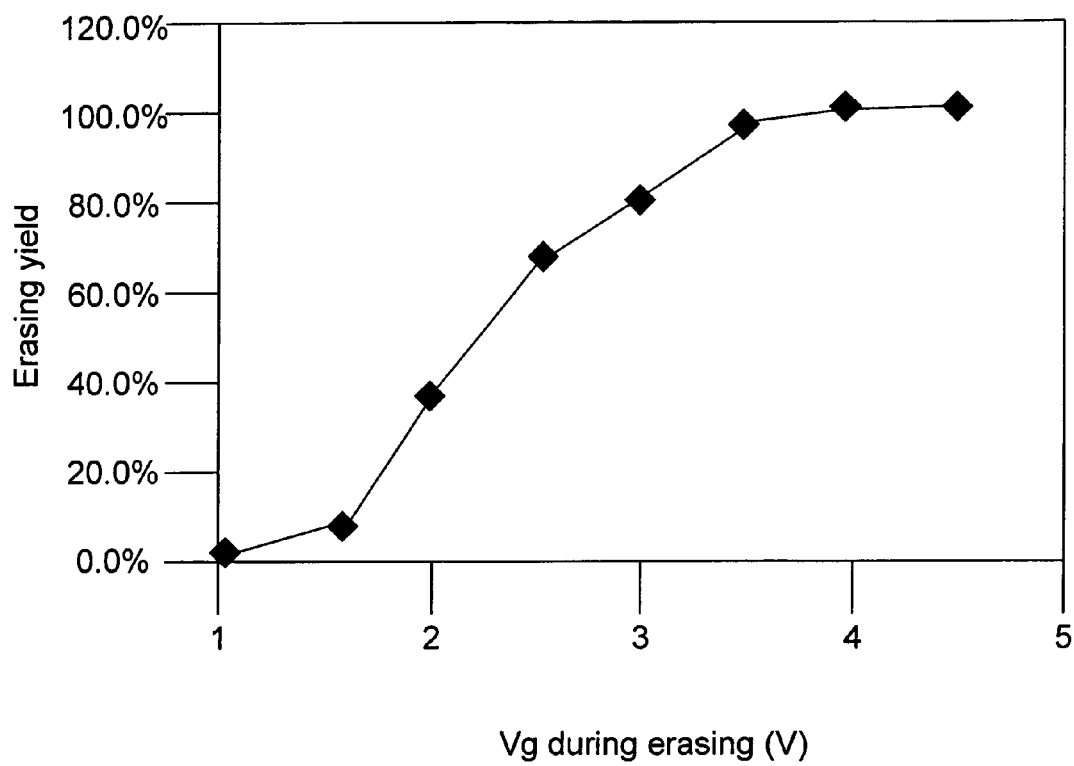
FIGS. 9 and 10 are graphs illustrating erasing characteristics of the device.
Figure 10:
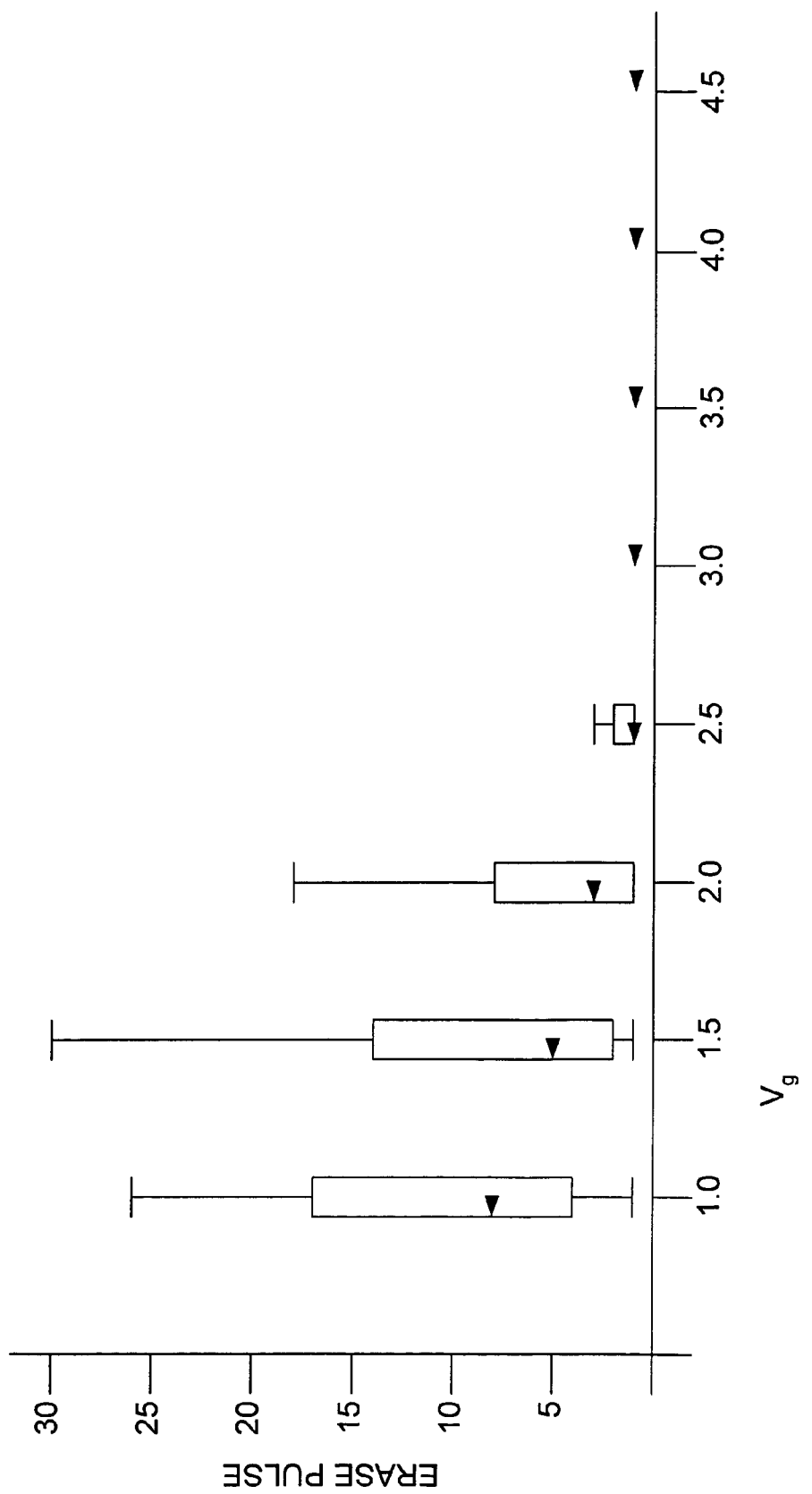
Figure 11:
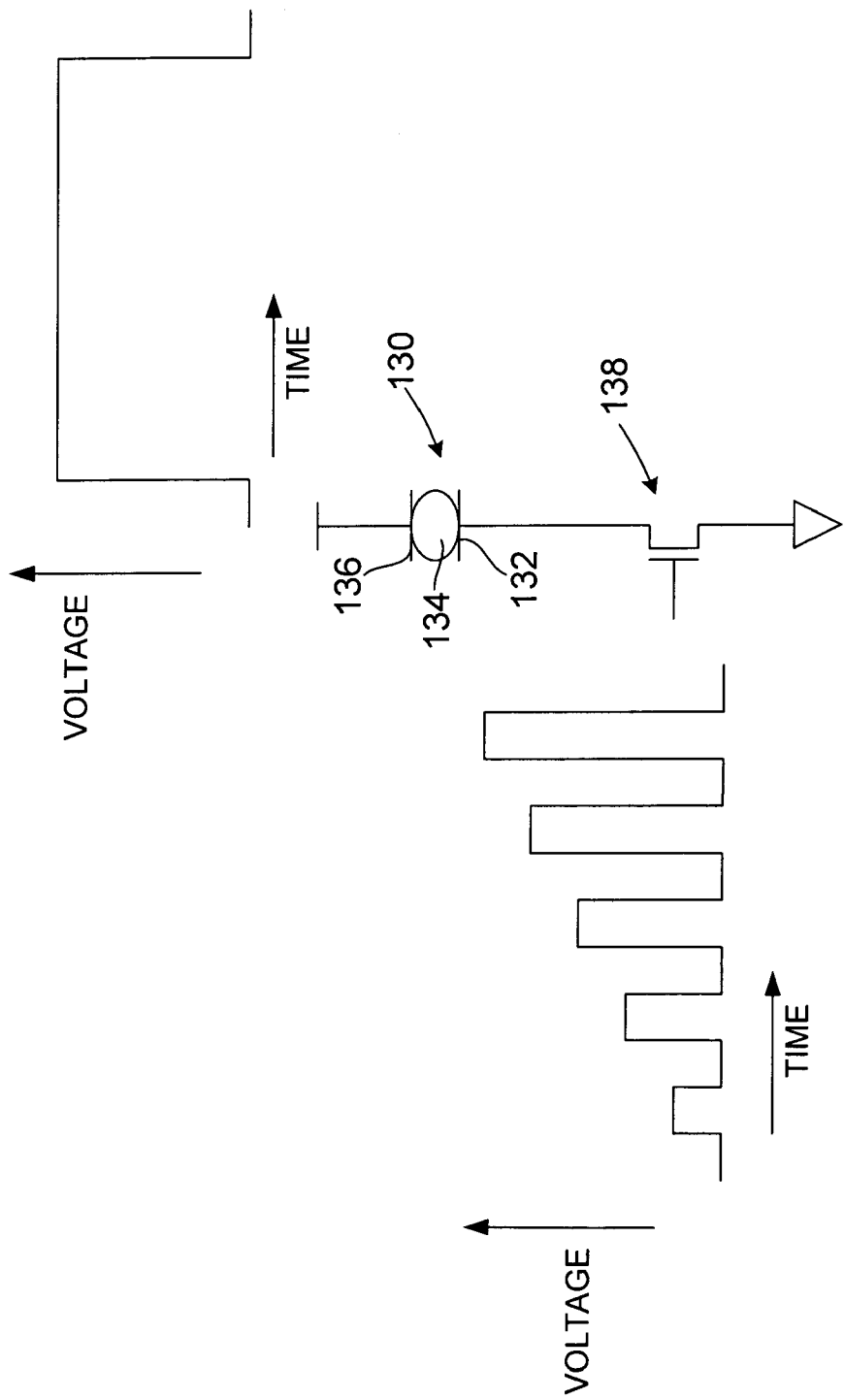
FIG. 11 is a schematic view illustrating erasing of the device of FIG. 3 in accordance with a second embodiment of the invention.

A second method of erasing is based on the characteristics of the memory device 130 described in FIGS. 9 and 10. FIG. 9 illustrates the impact of the transistor gate voltage on the erase yield, with constant voltage applied across the memory device 130. When insufficient voltage is applied on the transistor gate (e.g., 1V), the current through the memory device 130 during erase is severely limited and erase yield is almost 0%, no matter how high the voltage across the device 130 is. When and only when sufficiently high voltage is applied on the transistor gate will the erase yield approach 100%. FIG. 10 shows the number of flat-height pulses needed for erase as a function of the voltage applied on the transistor gate. When the gate voltage is too low (e.g., 1V), not only is the erase yield extremely low as shown in FIG. 9, but the number of pulses needed for the limited erased cells is also large. When the gate voltage is sufficiently high, only one pulse is needed to erase the cell, as shown by Vg>3V in FIG. 10. Therefore, the gate voltage, which controls the maximum current limit through the memory device 130 during erase, has a significant impact on the erase yield and the number of pulses needed for erase. The second method of erase utilizes the characteristics described above and improves the erase performance by controlling the current limit during erase.

Figure 12:
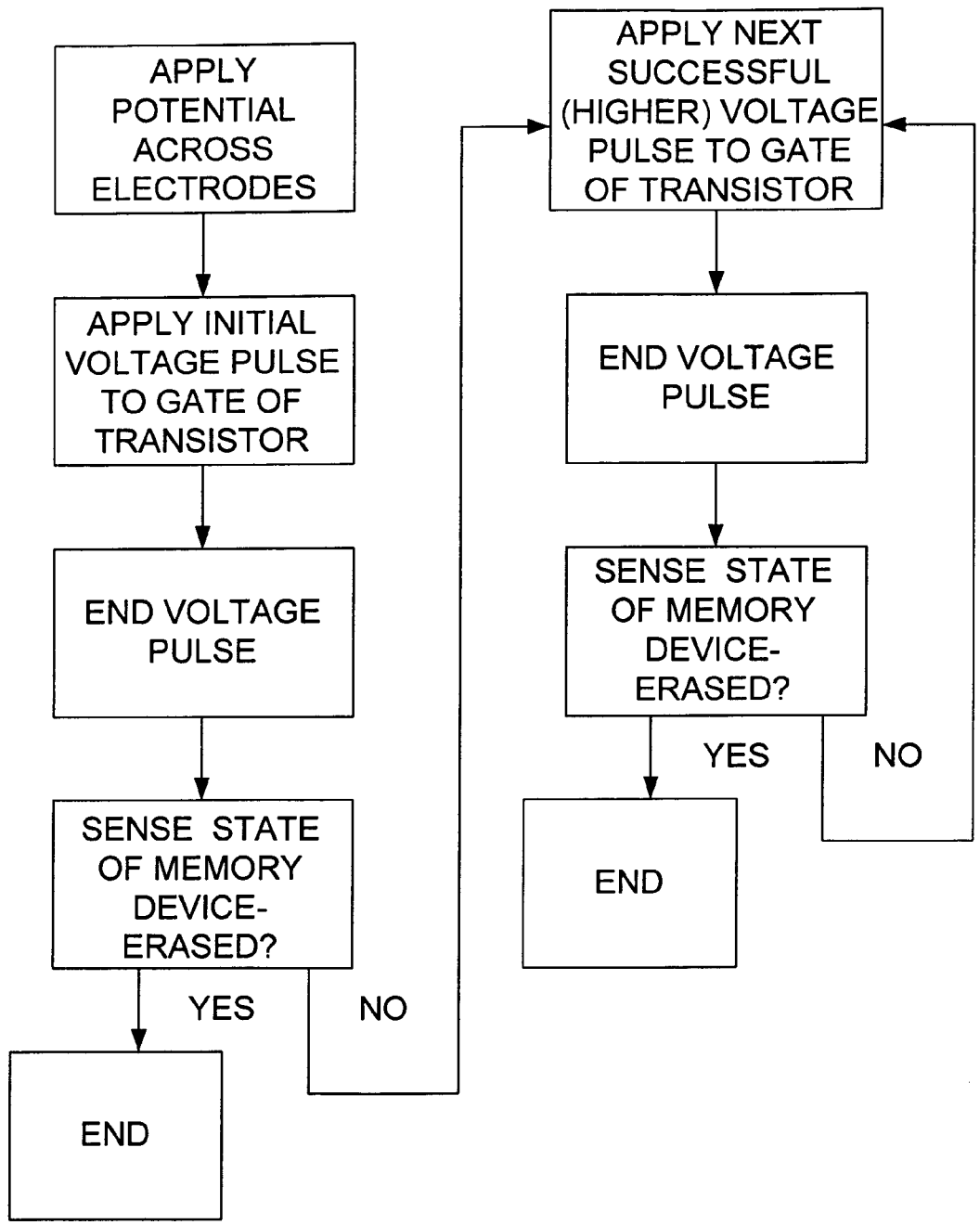
FIG. 12 is a flow chart illustrating steps in the method of FIG. 11.

In the second method, with reference to FIGS. 3, 6, 11 and 12, initially, a constant voltage is applied to the electrode 136 so that an electrical potential is applied across the device 130 from higher to lower potential in the direction from the electrode 136 to the electrode 132. This electrical potential is maintained while individual, successive, increasing electrical potentials in the form of voltage pulses are applied to the gate of the transistor 138. The successive voltage pulses, which may be as short as 10 ns, provide successively increasing levels of current limit through the memory device 130. When appropriate current limit (transistor gate voltage) is reached, the memory device 130 will be erased. As shown in FIGS. 9 and 10, erase yield increases and number of pulses needed for erase decreases with increasing transistor gate voltage. As explained above, application of an erasing electrical potential which is substantially greater than that required for erasing can result in overstress of the memory device. In order to avoid this problem, and with reference to FIG. 12, after the voltage is applied to the electrode 136 as described above, the initial voltage pulse is applied to the gate of the transistor 138, providing a first level of current limit through the device 130. After the first voltage pulse is ended, and before the beginning of the second, greater voltage pulse, the state of the memory device 130 is sensed by providing a read potential thereacross to determine if erasing has been achieved, i.e., the device 130 has been properly erased. If so, application of voltage to the gate of the transistor 138 is ended, and the device 130 can be considered erased. On the other hand, if erasing has not been achieved, the next successive (second) voltage pulse, greater in magnitude than the initial voltage pulse, is applied to the gate of the transistor 130. After this second voltage pulse is ended, and before the beginning of the third, greater voltage pulse, the state of the memory device 130 is sensed by providing a read potential thereacross to determine if erasing has been achieved, i.e., the device 130 has been properly erased. Again, if the device 130 has been so erased, application of voltage to the gate of the transistor 138 is ended, and the device 130 can be considered erased. If such erasing has not been achieved, the process is continued as illustrated in FIG. 12 until the level of current through the device 130 is achieved to provide proper erasing.

It will be noted that only the minimum number of successive, increasing voltage pulses on the gate of the transistor 138 (and resulting successive, increasing pulsed currents through the memory device 130) are needed and used to erase the device 130. This approach allows for efficient erasing of the device 130. That is, as the level of voltage on the gate of the transistor 138 is ramped up through application of the successive voltage pulses, the programming process ends as soon as the level of voltage applied to the gate is sufficient to provide the chosen erase current limit for erasing through the device 130.

Figure 13:
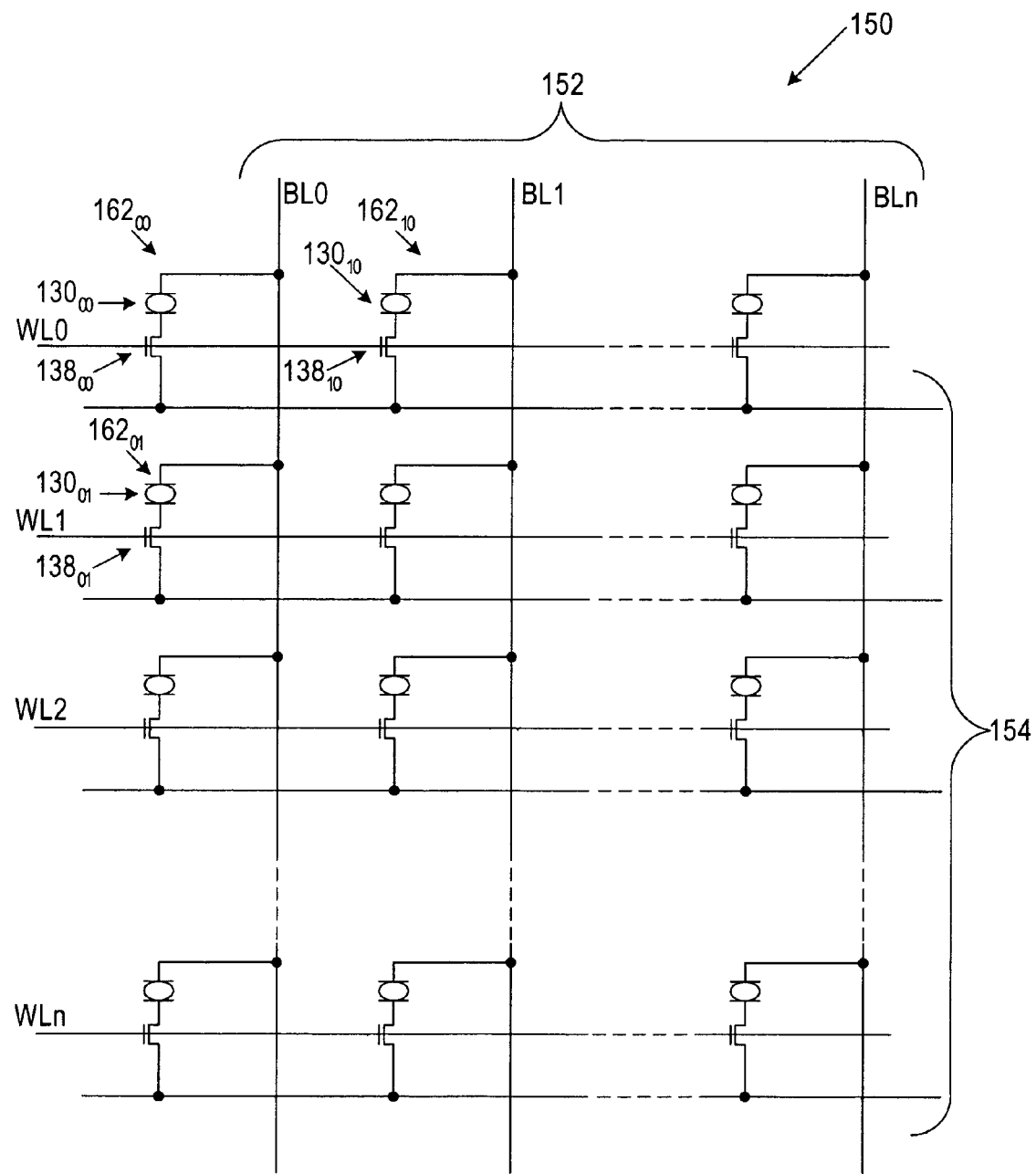
FIG. 13 is a schematic view of a first embodiment of an array of memory devices for practicing the present invention.

FIG. 13 illustrates a high density memory device array 150 which incorporates memory devices 130 and transistors 138 as described above. As illustrated in FIG. 13, the memory device array 150 includes a first plurality 152 of parallel conductors (bit lines) BL0, BL1, . . . BLn, and a second plurality 154 of parallel conductors (word lines) WL0, WL1, . . . WLn overlying and spaced from, orthogonal to, and crossing the first plurality of conductors 152. A plurality of memory devices 130 of the type described above are included, each in series with a transistor 138, to form a memory device-transistor structure 162. Each memory device 130 is connected in series with a transistor 138, with each word line connecting the gates of a row of transistors 138. The sources of the transistors 138 in each row thereof are connected. Both erase approaches may be used with this array 150, the transistors 138 acting as select devices and current limiting devices in the array 150.

Figure 14:
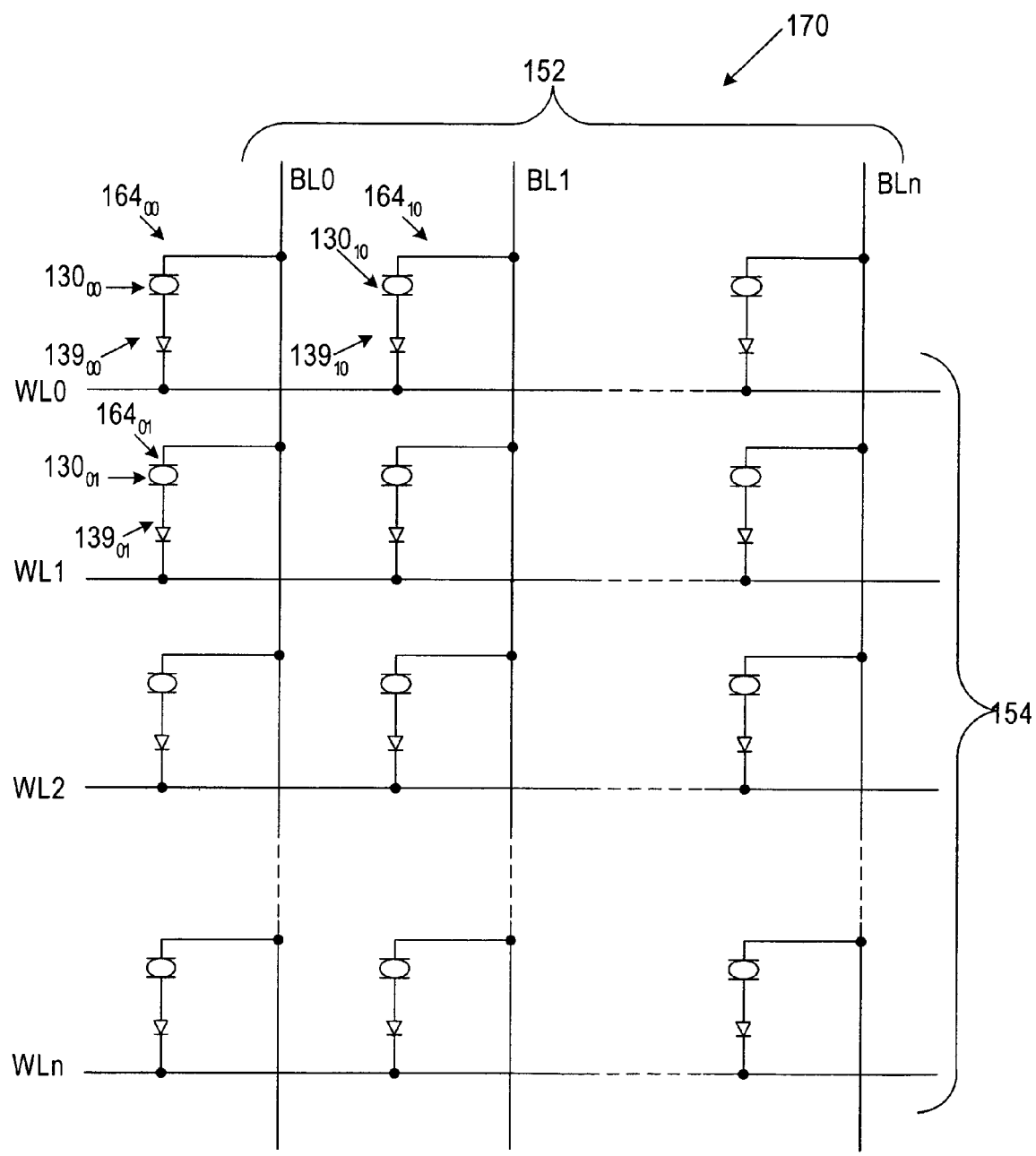
FIG. 14 is a schematic view of a second embodiment of an array of memory devices for practicing the present invention.

FIG. 14 illustrates a high density memory device array 170 which incorporates memory devices 130 and diodes 139 as described above. As illustrated in FIG. 14, the memory device array 150 includes a first plurality 152 of parallel conductors (bit lines) BL0, BL1, . . . BLn, and a second plurality 154 of parallel conductors (word lines) WL0, WL1, . . . WLn overlying and spaced from, orthogonal to, and crossing the first plurality of conductors 152. A plurality of memory devices 130 of the type described above are included, each in series with a diode 139, to form a memory device-diode structure 164 interconnecting a bit line and a word line. The diodes 139 act as select devices in the array 170. Current is appropriately limited by a transistor or transistors outside and connected to the array 170 (not shown).

Both approaches as disclosed herein provide proper and efficient erasing of a resistive memory device. Both erase methods use a voltage polarity the same as in programming, i.e., the memory device 130 is erased using the same voltage direction as in programming. Therefore, memory device 130 can be selected with a two-terminal device, such as a diode, instead of a three-terminal transistor, so that a stackable memory structure including a memory device and diode can be achieved.

FIG. 15 illustrates a system 200 utilizing memory devices as described above. As shown therein, the system 200 includes hand-held devices in the form of cell phones 202, which communicate through an intermediate apparatus such as a tower 204 (shown) and/or a satellite. Signals are provided from one cell phone to the other through the tower 204. Such a cell phone 202 with advantage uses memory devices of the type described above for data storage, for example names, telephone number and other data. One skilled in the art will readily understand the advantage of using such memory devices in other hand-held devices which utilize data storage, such as portable media players, personal digital assistants, digital cameras and the like.

FIG. 16 illustrates another system 300 utilizing memory devices as described above. The system 300 includes a vehicle 302 having an engine 304 controlled by an electronic control unit 306. The electronic control unit 306 with advantage uses memory devices of the type described above for data storage, for example data relating to engine and vehicle operating conditions.

Figure 17:
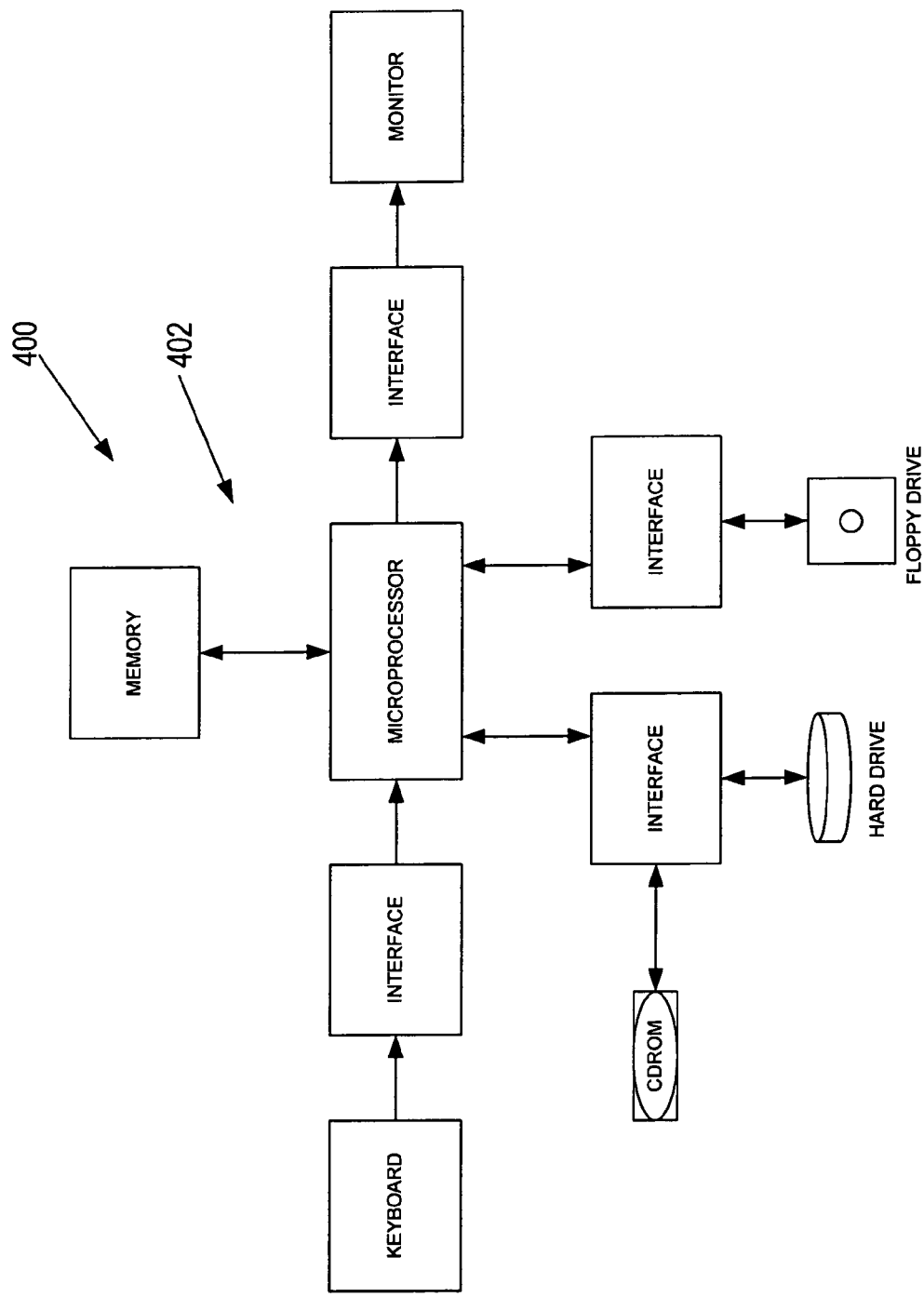

FIG. 17 illustrates yet another system 400 utilizing memory devices as described above. This system 400 is a computer 402 which includes an input in the form of a keyboard, and a microprocessor for receiving signals from the keyboard through an interface. The microprocessor also communicates with a CDROM drive, a hard drive, and a floppy drive through interfaces. Output from the microprocessor is provided to a monitor through an interface. Also connected to and communicating with the microprocessor is memory which may take the form of ROM, RAM, flash and/or other forms of memory. The memory with advantage uses memory devices of the type described above for storage of any data which is of use.

The foregoing description of the embodiments of the invention has been presented for purposes of illustration and description. It is not intended to be exhaustive or to limit the invention to the precise form disclosed. Other modifications or variations are possible in light of the above teachings.

The embodiments were chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A method of erasing a resistive memory device which may have a plurality of successive increasing pulsed electrical potentials applied across the resistive memory device, comprising:
    applying the minimum number of successive electrical potentials across the resistive memory device to erase the resistive memory device; and
    sensing a state of the resistive memory device after each application of electrical potential, wherein a current control device connected to the resistive memory device controls current through the resistive memory device.

2. The method of claim 1 wherein erasing of the resistive memory device comprises moving electronic charge carriers in the resistive memory device.

3. The method of claim 1 wherein sensing the state of the resistive memory device comprises reading the state of the resistive memory device.

4. The method of claim 1 and further comprising a plurality of said memory devices making up an array thereof.

5. The method of claim 4 and further comprising select devices in the array.

6. The method of claim 5 wherein the select devices are diodes.

7. The method of claim 5 wherein the select devices are transistors.

8. The method of claim 1 and further comprising said memory device incorporated in a system.

9. The method of claim 8 wherein the system is selected from the group consisting of a hand-held device, a vehicle, and a computer.

10. A method of erasing a resistive memory device comprising:
    applying an electrical potential across the resistive memory device; and
    applying increasing electrical potential to the gate of a transistor operatively associated with the resistive memory device to erase the resistive memory device, wherein a state of the resistive memory device is sensed after each application of increasing electrical potential, and wherein a current control device connected to the resistive memory device controls current through the resistive memory device.

11. The method of claim 10 wherein the increasing electrical potential is a series of pulsed electrical potentials.

12. The method of claim 10 and further comprising said memory device incorporated in a system.

13. The method of claim 12 wherein the system is selected from the group consisting of a hand-held device, a vehicle, and a computer.

14. A method of erasing a resistive memory device comprising:
    applying an electrical potential across the resistive memory device; and
    applying successive electrical potentials to the gate of a transistor operatively associated with the resistive memory device to erase the resistive memory device, wherein a state of the resistive memory device is sensed after each application of electrical potential, and wherein a current control device connected to the resistive memory device controls current through the resistive memory device.

15. The method of claim 14 wherein the successive electrical potentials are successive increasing electrical potentials.

16. The method of claim 15 wherein the successive increasing potentials are pulsed electrical potentials.

17. The method of claim 14 wherein erasing of the resistive memory device comprises moving electronic charge carriers in the resistive memory device.

18. The method of claim 14 wherein the resistive memory device and transistor are in series.

19. The method of claim 14 wherein sensing the state of the resistive memory device comprises reading the state of the resistive memory device.

20. The method of claim 14 and further comprising a plurality of said memory devices making up an array thereof.

21. The method of claim 20 and further comprising select devices in the array.

22. The method of claim 21 wherein a plurality of transistors operatively associated with said memory devices act as the select devices.

23. A method of erasing a resistive memory device comprising:
    applying a series of successive increasing pulsed currents through the resistive memory device; and
    sensing the state of the resistive memory device after each application of current, wherein a current control device connected to the resistive memory device controls current through the resistive memory device.

* * * * *